US012796506B2

(12) United States Patent
Hong

(10) Patent No.: US 12,796,506 B2
(45) Date of Patent: Nov. 10, 2026

(54) SEMICONDUCTOR PACKAGE

(71) Applicant: SAMSUNG ELECTRONICS CO., LTD., Suwon-si (KR)

(72) Inventor: Sojeong Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 317 days.

(21) Appl. No.: 18/409,023

(22) Filed: Jan. 10, 2024

(65) Prior Publication Data

US 2025/0046698 A1 Feb. 6, 2025

(30) Foreign Application Priority Data

Aug. 3, 2023 (KR) ........................ 10-2023-0101352
Aug. 16, 2023 (KR) ........................ 10-2023-0107194

(51) Int. Cl.

| | |
|---|---|
| ***H10W 70/65*** | (2026.01) |
| ***H10W 70/685*** | (2026.01) |
| ***H10W 72/20*** | (2026.01) |
| ***H10W 74/10*** | (2026.01) |
| ***H10W 90/00*** | (2026.01) |

(52) U.S. Cl.

CPC ......... *H10W 70/65* (2026.01); *H10W 70/685* (2026.01); *H10W 74/117* (2026.01); *H10W 90/701* (2026.01); *H10W 72/252* (2026.01); *H10W 90/724* (2026.01)

(58) Field of Classification Search

CPC . H10W 74/117; H10W 70/65; H10W 90/701; H10W 70/685; H10W 72/252; H10W 90/724; H10W 70/69

See application file for complete search history.

(56) References Cited

U.S. PATENT DOCUMENTS

| | | | | |
|---|---|---|---|---|
| 8,017,875 | B2 | 9/2011 | Kawamura et al. | |
| 8,624,132 | B2 | 1/2014 | Kawamura et al. | |
| 9,245,863 | B2 | 1/2016 | Yu et al. | |
| 9,331,036 | B2 | 5/2016 | Nagasawa | |
| 10,515,917 | B2 | 12/2019 | Chuang et al. | |
| 10,998,282 | B2 | 5/2021 | Unruh et al. | |
| 2017/0125333 | A1* | 5/2017 | Tomizawa | H10W 70/05 |
| 2020/0251437 | A1 | 8/2020 | Park | |
| 2024/0222304 | A1* | 7/2024 | Shan | H10W 70/60 |
| 2024/0381530 | A1* | 11/2024 | Na | H05K 1/02 |

FOREIGN PATENT DOCUMENTS

KR 10-2007-0099219 10/2007

* cited by examiner

*Primary Examiner* — Moazzam Hossain

(74) *Attorney, Agent, or Firm* — Morgan, Lewis & Bockius LLP

(57) ABSTRACT

Disclosed is a semiconductor package including a package substrate and a semiconductor chip on the package substrate. The package substrate includes a wiring layer, a plurality of pads arranged in rows on the wiring layer, and a solder resist pattern on the wiring layer. The solder resist pattern includes openings that expose the pads. A first opening is positioned nearest an end of a row, wherein the first opening has a cross-section including a first inner lateral surface and a second inner lateral surface that face each other. A slope of the first inner lateral surface is about 10 or more degrees less than a slope of the second inner lateral surface.

20 Claims, 13 Drawing Sheets

SEMICONDUCTOR PACKAGE

CROSS-REFERENCE TO RELATED APPLICATIONS

This U.S. nonprovisional application claims priority under 35 U.S.C. § 119 to Korean Patent Applications No. 10-2023-0101352, filed on Aug. 3, 2023 and No. 10-2023-0107194, filed on Aug. 16, 2023 in the Korean Intellectual Property Office, the disclosures of which are incorporated by reference herein in their entirety.

TECHNICAL FIELD

Embodiments of the present inventive concepts relate to a semiconductor package, and more particularly, to a semiconductor package including a solder resist on a wiring layer in a package substrate.

DISCUSSION OF RELATED ART

A semiconductor package facilitates the housing and electrical connection of integrated circuit chips in electronic products. A semiconductor package is typically configured such that a semiconductor chip is mounted on a printed circuit board and bonding wires or bumps are used to electrically connect the semiconductor chip to the printed circuit board.

SUMMARY

According to some embodiments of the present inventive concepts, a semiconductor package includes a package substrate and a semiconductor chip on the package substrate. The package substrate includes a wiring layer, a plurality of pads arranged in rows on the wiring layer, and a solder resist pattern on the wiring layer. The solder resist pattern includes openings that expose the pads. A first opening is positioned nearest an end of a row, wherein the first opening has a cross-section including a first inner lateral surface and a second inner lateral surface that face each other. A slope of the first inner lateral surface is about 10 or more degrees less than a slope of the second inner lateral surface.

According to some embodiments of the present inventive concepts, a semiconductor package may include a substrate and a semiconductor chip on the substrate. The substrate includes a wiring layer, a plurality of pads arranged in rows on the wiring layer, and a solder resist pattern that covers the wiring layer. The solder resist pattern includes openings that correspondingly expose the pads. The pads include a first pad positioned nearest an end of a first row and a second pad positioned adjacent to the first pad. The openings include a first opening that exposes the first pad and a second opening that exposes the second pad. The first opening has a width that is larger than the width of the second opening and the width of the first opening decreases with decreasing distance from a top surface of the first pad.

According to some embodiments of the present inventive concepts, a semiconductor package may include a package substrate, a semiconductor chip on the package substrate, and a molding layer that covers the semiconductor chip and a top surface of the package substrate. The package substrate includes a wiring layer, a plurality of pads on the wiring layer, and a solder resist pattern that covers the wiring layer. The solder resist pattern has a tetragonal shape with four edges. The solder resist pattern includes a first opening close to the four edges and a second opening farther away than the first opening from the four edges. The first opening and the second opening expose the pads. A cross-section of the first opening includes a first inner lateral surface and a second inner lateral surface that face each other. The first inner lateral surface is closer than the second inner lateral surface to a lateral surface of the wiring layer. The first inner lateral surface has a slope of about 10° to about 80°.

DETAILED DESCRIPTION OF EMBODIMENTS

The following will now describe in detail some embodiments of the present inventive concepts with reference to the accompanying drawings.

While each drawing may represent one or more particular embodiments of the present disclosure, drawn to scale, such that the relative lengths, thicknesses, and angles can be inferred therefrom, it is to be understood that the present invention is not necessarily limited to the relative lengths, thicknesses, and angles shown. Changes to these values may be made within the spirit and scope of the present disclosure, for example, to allow for manufacturing limitations and the like.

Figure 1:
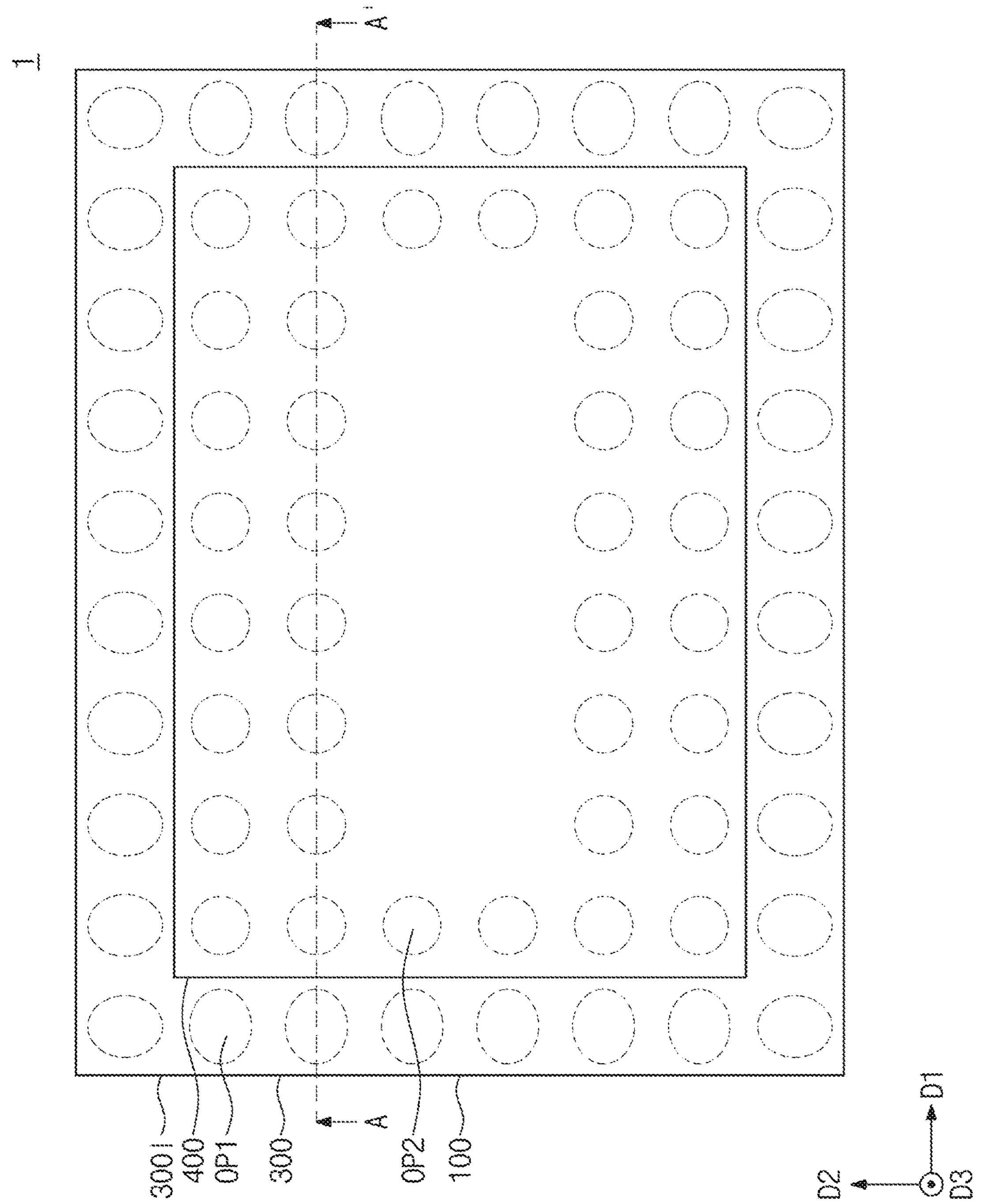
FIG. 1 is a plan view showing a semiconductor package according to some embodiments of the present inventive concepts.
Figure 2:
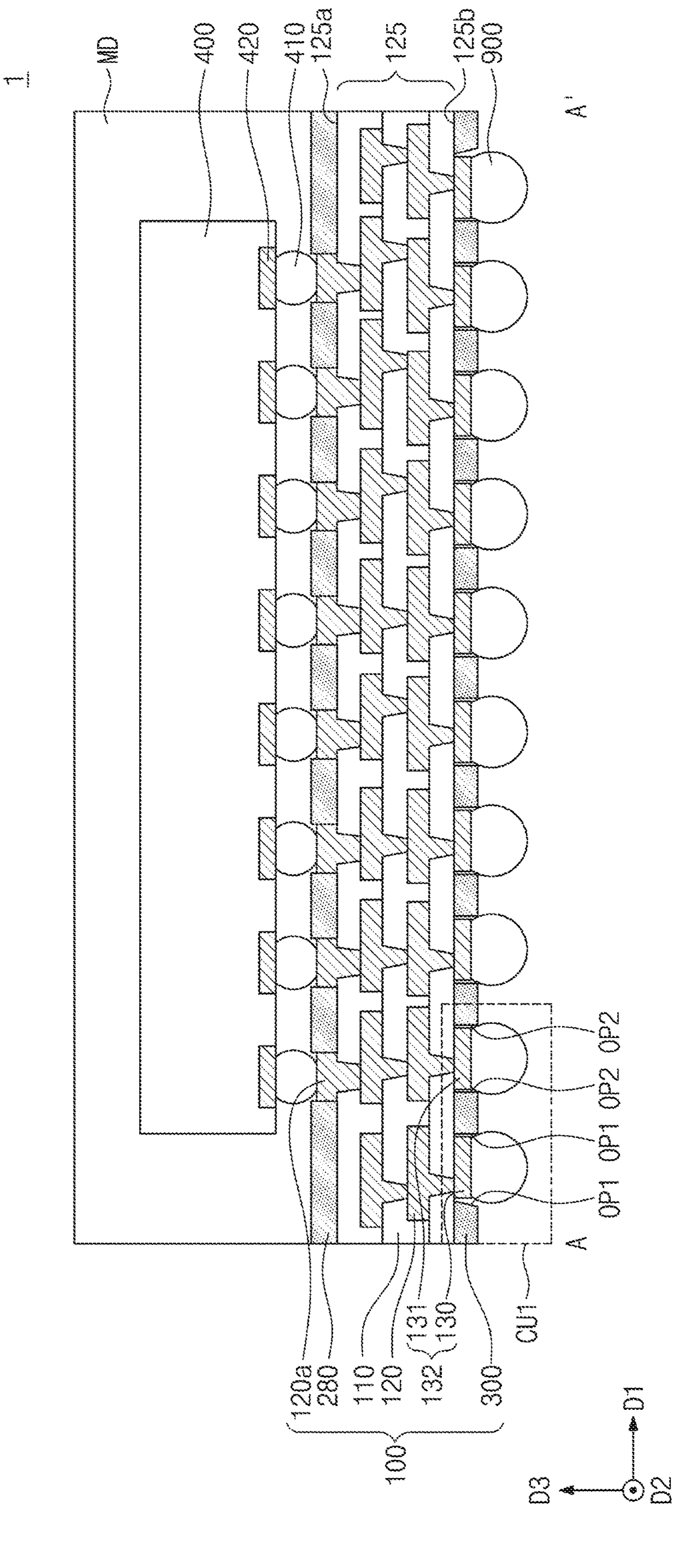
FIG. 2 is a cross-sectional view taken along line A-A' of FIG. 1.
Figure 3:
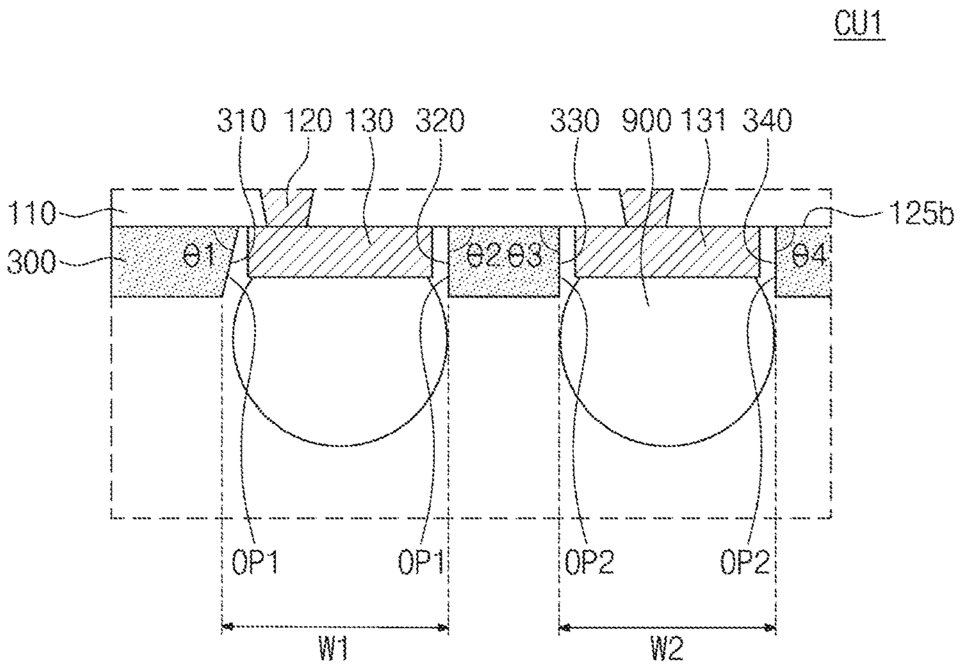
FIG. 3 is an enlarged view showing section CU1 of FIG. 2.
Figure 4:
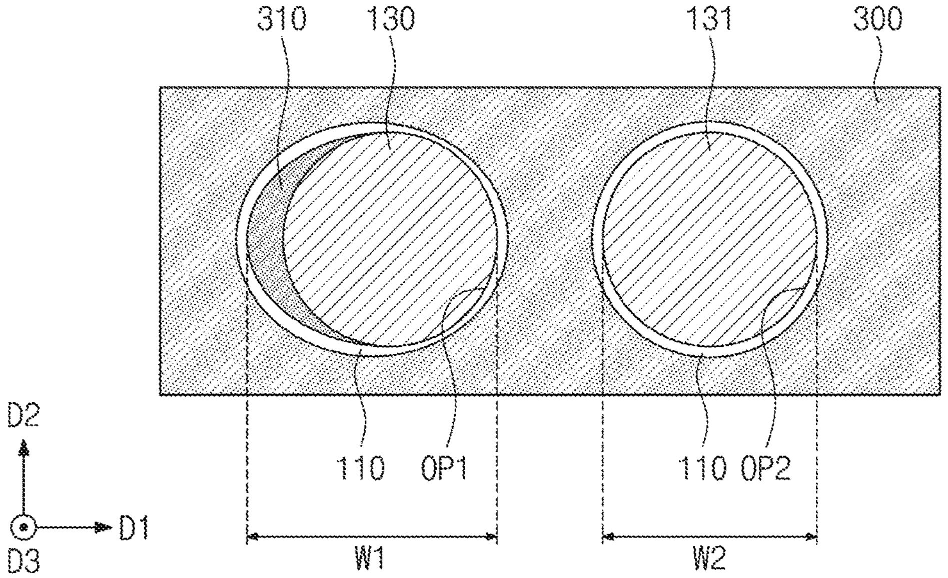
FIG. 4 is a bottom view depicting a state in which an external connection terminal is omitted in FIG. 3.

FIG. 1 is a plan view showing a semiconductor package according to some embodiments of the present inventive concepts. FIG. 2 is a cross-sectional view taken along line A-A' of FIG. 1. FIG. 3 is an enlarged view showing section CU1 of FIG. 2. FIG. 4 is a bottom view depicting a state in which an external connection terminal is omitted in FIG. 3.

Referring to FIGS. 1, 2, 3, and 4, a semiconductor package 1 according to the present inventive concepts include a package substrate 100, a semiconductor chip 400, and a molding layer MD.

In this description, a first direction D1 may indicate a direction parallel to a top surface of the package substrate 100. A second direction D2 may indicate a direction parallel to the top surface of the package substrate 100 and orthogonal to the first direction D1. A third direction D3 may indicate a direction perpendicular to the top surface of the package substrate 100.

The package substrate 100 may be a printed circuit board (PCB). The package substrate 100 may include a first wiring layer 125, a first solder resist pattern 280, a second solder resist pattern 300, and a substrate pad 132.

The first wiring layer 125 may include a first surface 125*a* and a second surface 125*b* that face each other. The first surface 125*a* of the first wiring layer 125 is disposed above the second surface 125*b* of the first wiring layer 125. For example, the first surface 125*a* may be a top surface of the first wiring layer 125 and the second surface 125*b* may be a bottom surface of the first wiring layer 125.

The first wiring layer 125 may include a base layer and first wiring patterns 120. The base layer may include a plurality of first dielectric layers 110 that are stacked on each other. FIG. 2 depicts that three first dielectric layers 110 are stacked, but the present inventive concepts are not necessarily limited thereto. The number of the first dielectric layers 110 stacked in the package substrate 100 may be vary. For example, there may be two or more first dielectric layers 110 stacked in the package substrate 100.

The first wiring patterns 120 may be provided in the first dielectric layers 110 and arranged in rows. The first wiring pattern 120 may include a via part and a line part that are integrally connected into a piece. The line part may horizontally connect the first wiring patterns 120 within the package substrate 100. The via part may vertically connect the first wiring patterns 120 within the first dielectric layers 110. The line part may have a width greater than that of the via part. For example, each of the first wiring patterns 120 may have a T-shaped cross-section. The line part of the first wiring pattern 120 may be positioned on a top surface of the first dielectric layer 110. The via part of the first wiring pattern 120 may vertically penetrate the first dielectric layer 110 to be coupled to the line part of an underlying first wiring pattern 120.

The dielectric layer 110 may include a dielectric polymer material. The first wiring patterns 120 may include metal or a conductive material. For example, the first wiring patterns 120 may include copper (Cu).

The first wiring patterns 120 may include first wiring pads 120*a*. The first wiring pad 120*a* may be a portion of an uppermost first wiring pattern 120 in the package substrate 100. For example, the first wiring pads 120*a* may be the first wiring patterns 120 exposed on the first surface 125*a* of the first wiring layer 125. The first wiring pads 120*a* may be coupled to underlying first wiring patterns 120.

The first solder resist pattern 280 may be disposed on the first surface 125*a* of the first wiring layer 125. A top surface of the first solder resist pattern 280 may be located at a level higher than top surfaces of the first wiring pads 120*a*.

The substrate pads 132 may be arranged in rows on the second surface 125*b* of the first wiring layer 125. The substrate pads 132 may be connected to the first wiring patterns 120. For example, the via part of a lowermost first wiring patterns 120 may penetrate the first dielectric layer 110, establishing a connection with the substrate pad 132. The substrate pads 132 may include a conductive material. For example, the substrate pads 132 may include copper (Cu).

The substrate pads 132 may include a first pad 130 disposed at a nearest an end of a row, and a second pad 131 disposed towards an inner side of the row. For example, the first pad 130 may be positioned closer to the boundary of the semiconductor package 1 than the second pad 131. The first pad 130 may be exposed by a first opening OP1 of a second solder resist pattern 300. The second pad 131 may be exposed by a second opening OP2 of a second solder resist pattern 300.

The second solder resist pattern 300 may be disposed on the second surface 125*b* of the first wiring layer 125. A bottom surface of the second solder resist pattern 300 may be located at a level lower than that of bottom surfaces of the substrate pads 132. The second solder resist pattern 300 may have a tetragonal shape having four edges 3001 when viewed in plan.

The second solder resist pattern 300 may include the first opening OP1 and the second opening OP2. The first opening OP1 may be adjacent to the edge 3001 of the second solder resist pattern 300. The second opening OP2 may be positioned farther away from the edge 3001 of the second solder resist pattern 300 than the first opening OP1. For example, when viewed in plan, a plurality of first openings OP1 may be disposed along the edge 3001 of the second solder resist pattern 300, and the first opening OP1 may be disposed closer than the second opening OP2 to the edge 3001 of the second solder resist pattern 300. An area occupied by the second opening OP2 in the second solder resist pattern 300 may be larger than that the area occupied by the first opening OP1 in the second solder resist pattern 300.

The first opening OP1 may expose the first pad 130 positioned at the nearest an end of a row. The second opening OP2 may expose the second pad 131 positioned towards the inner side of the row. The first opening OP1 may have an oval shape when viewed in plan. The second opening OP2 may have a circular shape when viewed in plan.

A cross-section of the first opening OP1 may have a first inner lateral surface 310 and a second inner lateral surface 320 that face each other. A cross-section of the second opening OP2 may have a third inner lateral surface 330 and a fourth inner lateral surface 340 that face each other. The first opening OP1 may have a first width W1 along the first direction D1. The first opening OP1 may be a distance between the first inner lateral surface 310 and the second inner lateral surface 320. The second opening OP2 may have a second width W2 along the first direction D1. The second width W2 may be a distance between the third inner lateral surface 330 and the fourth inner lateral surface 340. The first width W1 may be greater than the second width W2.

In the first opening OP1, the first inner lateral surface 310 may be positioned closer to a lateral surface of the first wiring layer 125 than the second inner lateral surface 320. When viewed in cross-section, the first inner lateral surface 310 and the second inner lateral surface 320 may be asymmetric about the first pad 130. A slope θ1 of the first inner lateral surface 310 may be about 10 or more degrees less than a slope θ2 of the second inner lateral surface 320. For example, the slope θ1 of the first inner lateral surface 310 may range from about 10° to about 80° while the slope θ2 of the second inner lateral surface 320 may be about 90°. For example, the second inner lateral surface 320 may be perpendicular to the second surface 125*b* of the first wiring layer 125. A length of the first inner lateral surface 310 may be greater than that of the second inner lateral surface 320. The first width W1 of the first opening OP1 may decrease with decreasing distance from a top surface of the first pad 130. For example, the first width W1 may be wider when measured from an edge where the slope θ1 of the first inner lateral surface 310 forms, compared to the measurement taken from an edge below. The first width W1 may range from about 130 μm to about 150 μm.

In the second opening OP2, the third inner lateral surface 330 and the fourth inner lateral surface 340 may be symmetric when viewed in cross-section. A slope θ3 of the third inner lateral surface 330 may be substantially the same as the slope θ4 of the fourth inner lateral surface 340. In addition, the slope θ3 of the third inner lateral surface 330 and the slope θ4 of the fourth inner lateral surface 340 may be substantially the same as the slope θ2 of the second inner lateral surface 320. The slope θ3 of the third inner lateral surface 330 and the slope θ4 of the fourth inner lateral surface 340 may be about 90°. The third inner lateral surface 330 and the fourth inner lateral surface 340 may be perpendicular to the second surface 125*b* of the first wiring layer 125. Unlike the first width W1, the second width W2 of the second opening OP2 may be constant.

The substrate pads 132 may be correspondingly provided thereon with external connection terminals 900. The external connection terminals 900 may be electrically connected through the substrate pads 132 to the package substrate 100. The external connection terminals 900 may include solder balls or solder bumps. Based on type and arrangement of the external connection terminals 900, the external connection terminals 900 may be a ball grid array (BGA) type, a fine ball-grid array (FBGA) type, or a land grid array (LGA) type. The external connection terminal 900 may be an alloy that includes at least one selected from tin (Sn), silver (Ag), copper (Cu), nickel (Ni), bismuth (Bi), indium (In), antimony (Sb), and/or cerium (Ce).

The semiconductor chip 400 may be provided on the package substrate 100. The semiconductor chip 400 may be, for example, a logic chip or a memory chip. The semiconductor chip 400 may be, for example, one of a central processing unit (CPU), a graphic processing unit (GPU), an application specific integrated circuit (ASIC), a dynamic random access memory (DRAM), a static random access memory (SRAM), or an NAND Flash memory. A plurality of chip pads 420 may be disposed on a bottom surface of the semiconductor chip 400. For example, a base surface of the chip pad 420 may be in contact with the semiconductor chip 400.

The package substrate 100 and the semiconductor chip 400 may be provided therebetween with connection terminals 410. For example, the connection terminals 410 may be interposed between and in contact with the first wiring pads 120*a* and the chip pads 420. The semiconductor chip 400 may be electrically connected to the package substrate 100 through the connection terminals 410. The connection terminal 410 may be an alloy that includes at least one selected from tin (Sn), silver (Ag), copper (Cu), nickel (Ni), bismuth (Bi), indium (In), antimony (Sb), and/or cerium (Ce).

The molding layer MD may be disposed on the package substrate 100. The molding layer MD may be provided in a space between the semiconductor chip 400 and the package substrate 100 and on the top surface of the first solder resist pattern 280. For example, the molding layer MD may at least partially surround lateral surfaces of the connection terminals 410 located between the semiconductor chip 400 and the package substrate 100. The molding layer MD may include a dielectric material, and the dielectric material may include an epoxy molding compound (EMC) or an adhesive material.

FIGS. 5 to 9 are cross-sectional views showing a method of fabricating a semiconductor package according to some embodiments of the present inventive concepts. FIGS. 6B and 7B are enlarged views respectively showing sections CU2 and CU3 of FIGS. 6A and 7A.

Figure 5:
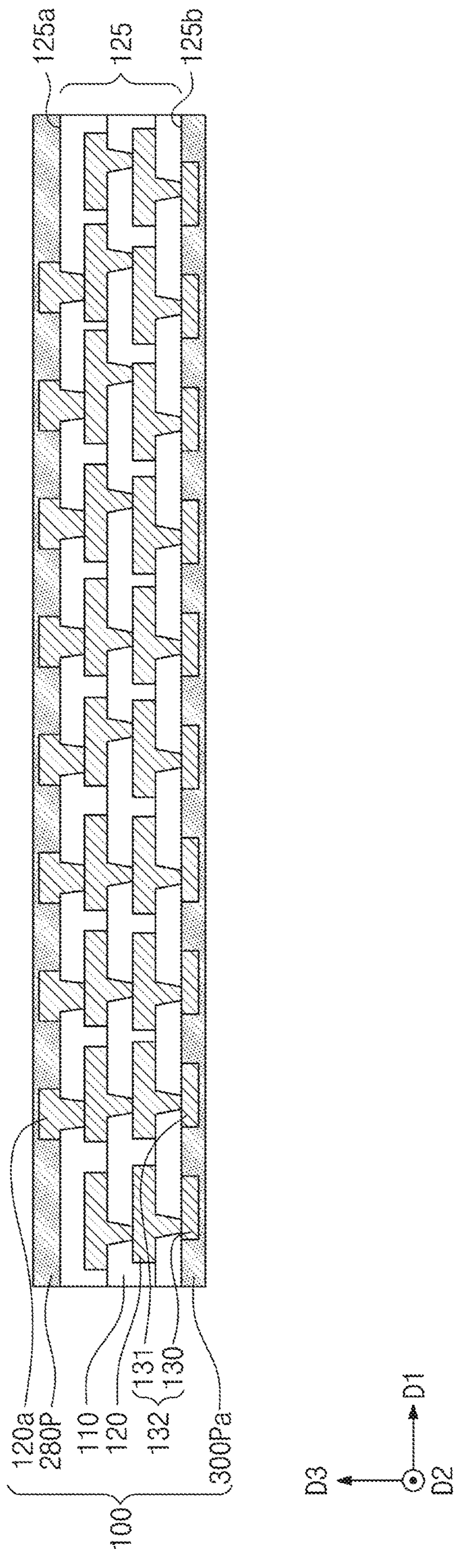
FIGS. 5, 6A, 6B, 7A, 7B, 8, and 9 are cross-sectional views showing a method of fabricating a semiconductor package according to some embodiments of the present inventive concepts.

Referring to FIG. 5, a package substrate 100 may be provided. The package substrate 100 may include a first wiring layer 125, substrate pads 132, a first preliminary solder resist layer 280P, and a second preliminary solder resist layer 300Pa.

The first preliminary solder resist layer 280P may cover top surface of first wiring pads 120*a*. The second preliminary solder resist layer 300Pa may cover bottom surface of the substrate pads 132.

Figure 6A:
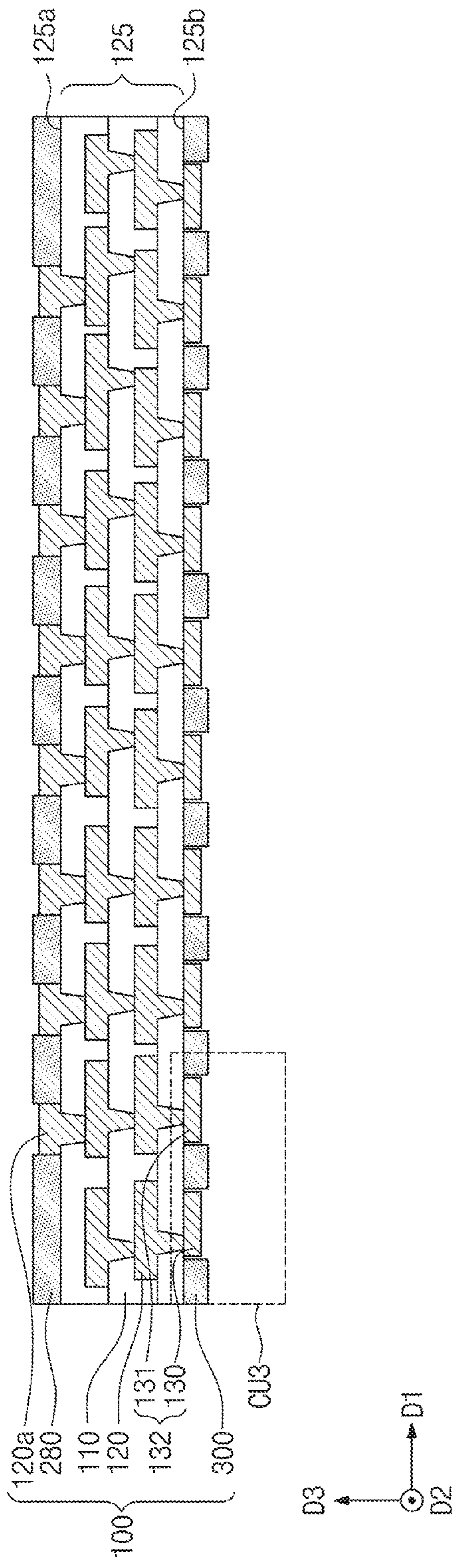
Figure 6B:
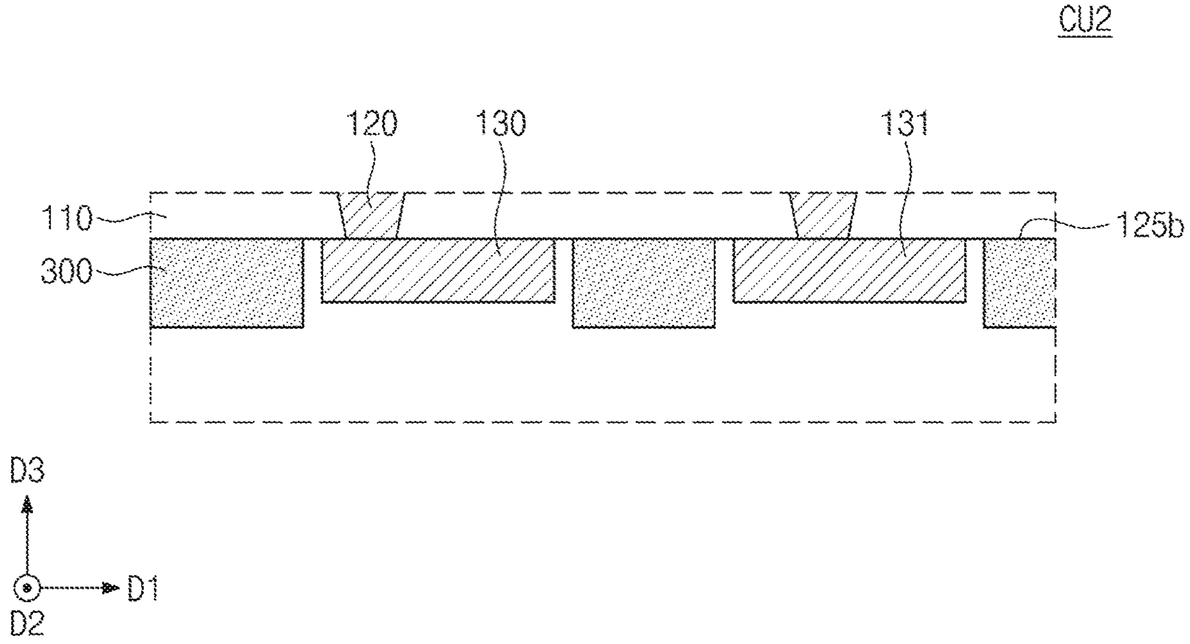

Referring to FIGS. 6A and 6B, the second preliminary solder resist layer 300Pa may undergo an ultraviolet (UV) exposure process to expose the substrate pad 132. The UV exposure process may include placing a masking layer on a region where the second preliminary solder resist layer 300Pa is formed except for a portion where the substrate pad 132 is exposed. When the UV exposure process is performed on the second preliminary solder resist layer 300Pa, the substrate pad 132 may be exposed to form a second solder resist pattern 300. The second solder resist pattern 300 may undergo an annealing process to cure the second solder resist pattern 300.

Afterwards, the first preliminary solder resist layer 280P may undergo an UV exposure process to expose the first wiring pads 120*a*. The UV exposure process performed on the first preliminary solder resist layer 280P may be substantially the same as the UV exposure process performed on the second preliminary solder resist layer 300Pa. When the UV exposure process is performed on the first preliminary solder resist layer 280P, the first wiring pads 120*a* may be exposed to form a first solder resist pattern 280.

Figure 7A:
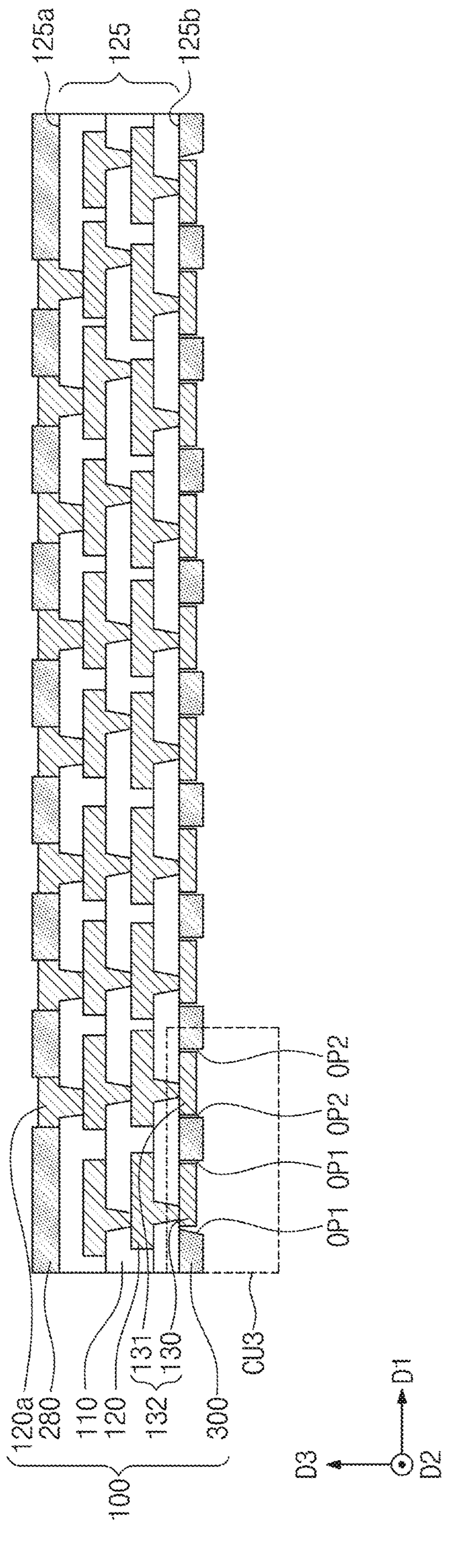
Figure 7B:
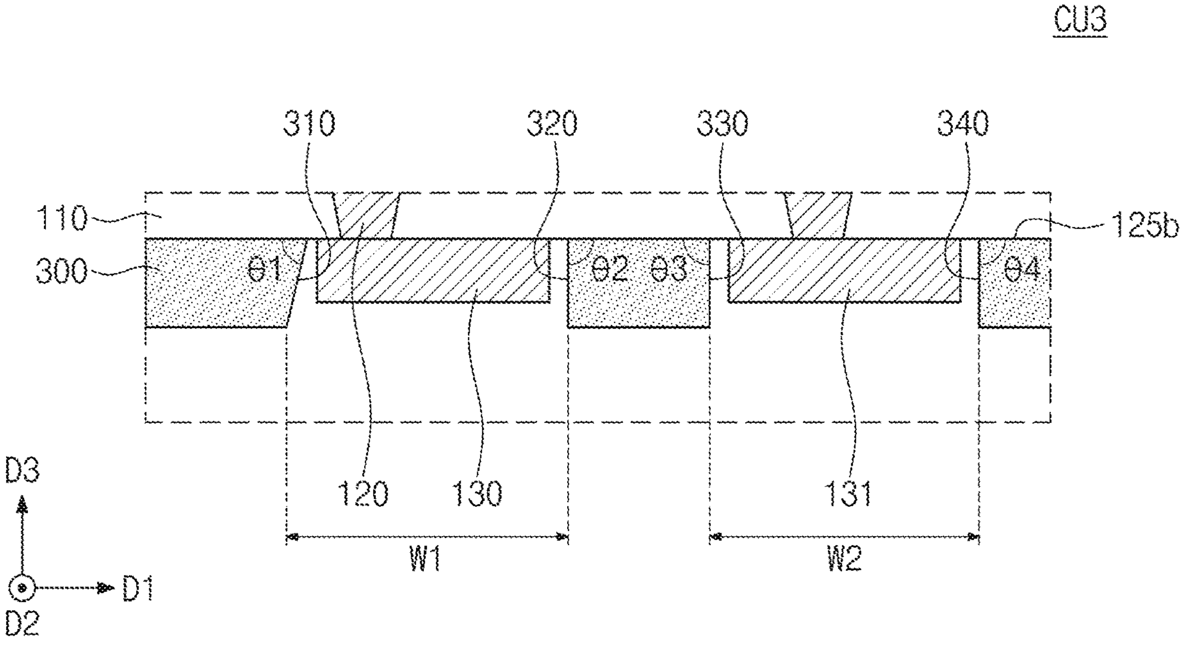

Referring to FIGS. 7A and 7B, on an opening region that exposes a first pad 130 positioned in the nearest an end of a row, an additional etching process may be performed on the second solder resist pattern 300. The etching process may form a first opening OP1 having a first inner lateral surface 310 and a second inner lateral surface 320. For example, the formation of the first opening OP1 may include forming a mask pattern that selectively exposes a portion where the first inner lateral surface 310 will be formed. The mask pattern is then used as an etching mask to perform the etching process to form the first inner lateral surface 310. Subsequently, the mask pattern may be removed. The etching process may include a dry etching process.

Figure 8:
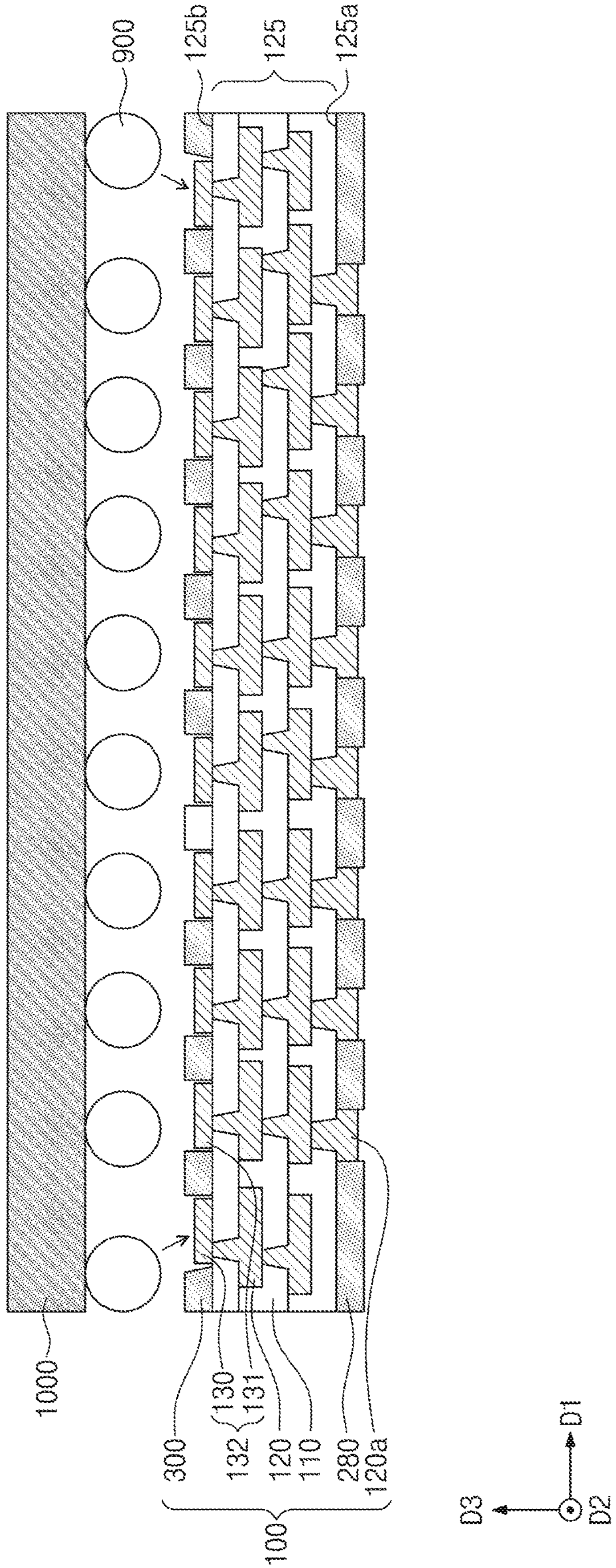

Referring to FIG. 8, the package substrate 100 may be overturned, and then external connection terminals 900 may attach to the substrate pads 132. An attach tool 1000 may align and attach the external connection terminals 900 to the substrate pads 132.

Referring back to FIG. 2, the package substrate 100 may be overturned, a semiconductor chip 400 may be mounted on the package substrate 100, and a molding layer MD may be formed to cover a top surface of the package substrate 100 and the semiconductor chip 400. This process may form a semiconductor package 1.

Figure 9:
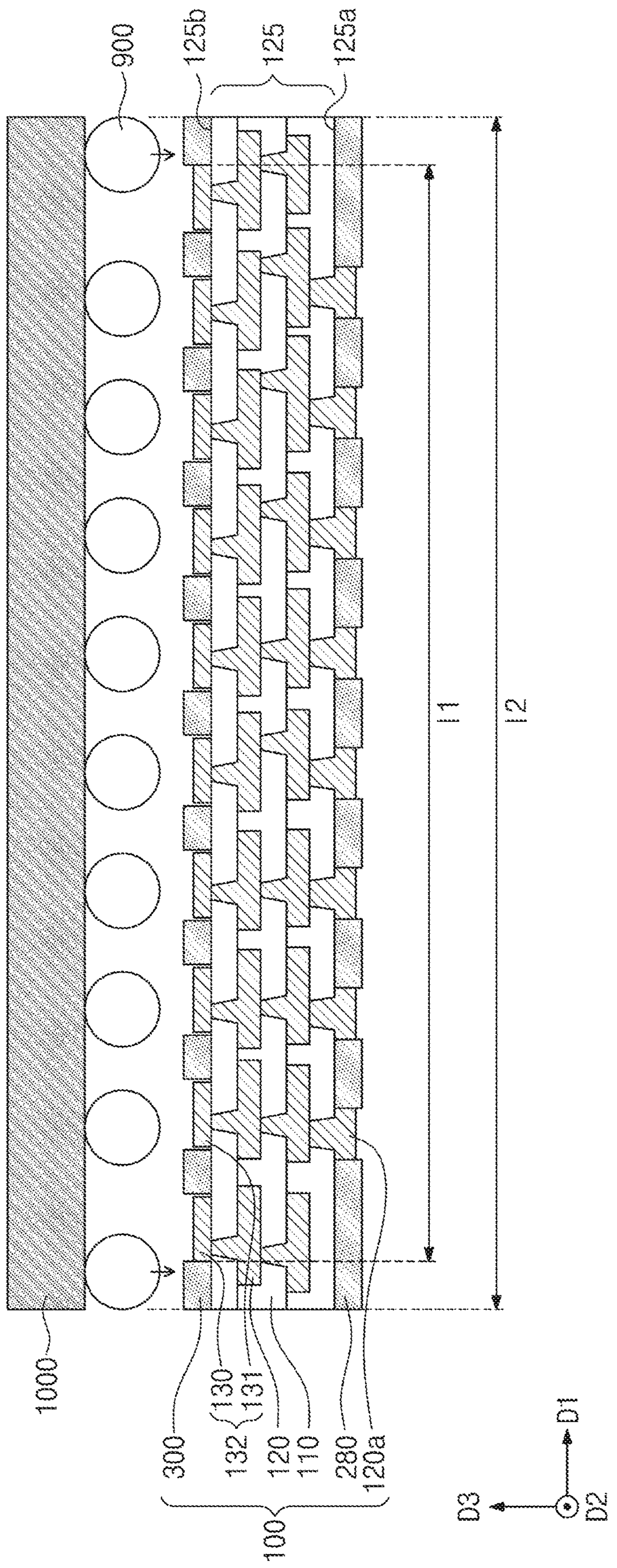

FIG. 9 is a cross-sectional view partially showing a method of fabricating a semiconductor package according to a comparative example. In detail, FIG. 9 is a cross-sectional view showing a corresponding process depicted in FIG. 8 in a method of fabricating a semiconductor package according to the present inventive concepts. To the extent that a process has not been described in detail herein, it may be assumed that they are at least similar to corresponding processes that have been described in FIG. 8.

Referring to FIGS. 8 and 9, a first length 11 may be a maximum distance in the first direction D1 between the first pads 130 positioned in the nearest an end of a row. For example, the first length 11 may be a distance between the first pad 130 disposed at the leftmost end and the first pad 130 disposed at the rightmost end. A second length 12 may be a maximum distance in the first direction D1 between the external connection terminals 900 attached to the first pads 130. The second length 12 may be about 50 micrometers or more greater than the first length 11. A difference between the first length 11 and the second length 12 may lead to a problem that the external connection terminals 900 are not stably attached to the first pads 130.

In some embodiments, the second solder resist pattern 300 may be configured such that a shape of an opening that exposes the first pad 130 disposed at the nearest an end of a row is substantially the same as a shape of an opening that exposes the second pad 131, disposed towards an inner side of the row. For example, in the second solder resist pattern 300 of a semiconductor package, openings that expose the substrate pads 132 may have their inner lateral surfaces without a slope. As a result, the external connection terminals 900 may not satisfactorily attach to the first pads 130 positioned in the nearest an end of the row.

In contrast, in the semiconductor package 1 according to some embodiments of the present inventive concepts, the second solder resist pattern 300 may include the first opening OP1 that exposes the first pad 130 positioned in the nearest an end of a row, and a cross-section of the first opening OP1 may have the first inner lateral surface 310 with a slope θ1. Thus, even if there is a difference between the first length 11 and the second length 12 when the external connection terminals 900 are attached to the substrate pads 132, the inclined first inner lateral surface 310 of the first opening OP1 may facilitate a stable attachment of the external connection terminal 900 to the first pads 130.

In addition, the first inner lateral surface 310 with a slope θ1 may be formed by an etching process on only one inner lateral surface of the first opening OP1 of the openings OP1 and OP2 included in the second solder resist pattern 300.

Figure 10:
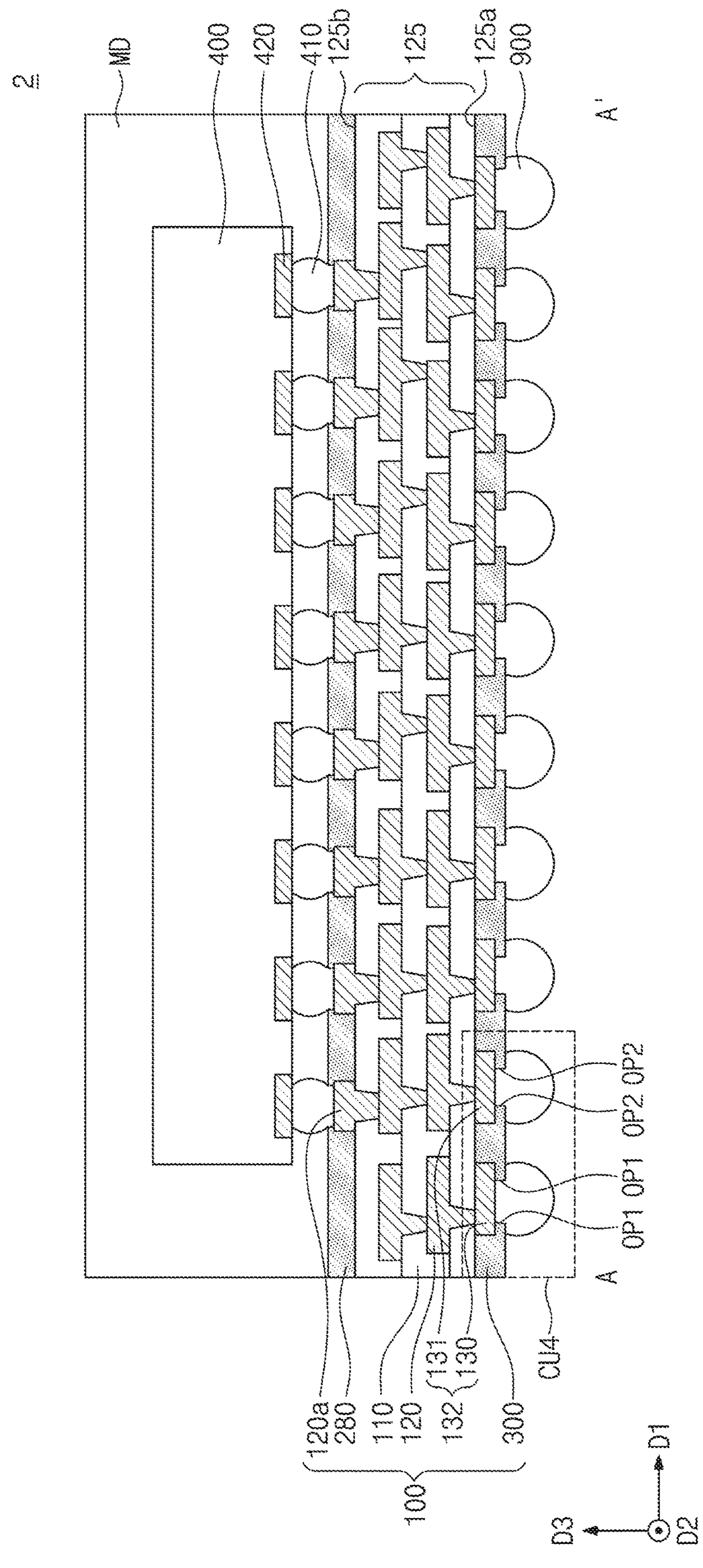
FIG. 10 is a cross-sectional view showing a semiconductor package according to some embodiments of the present inventive concepts.
Figure 11:
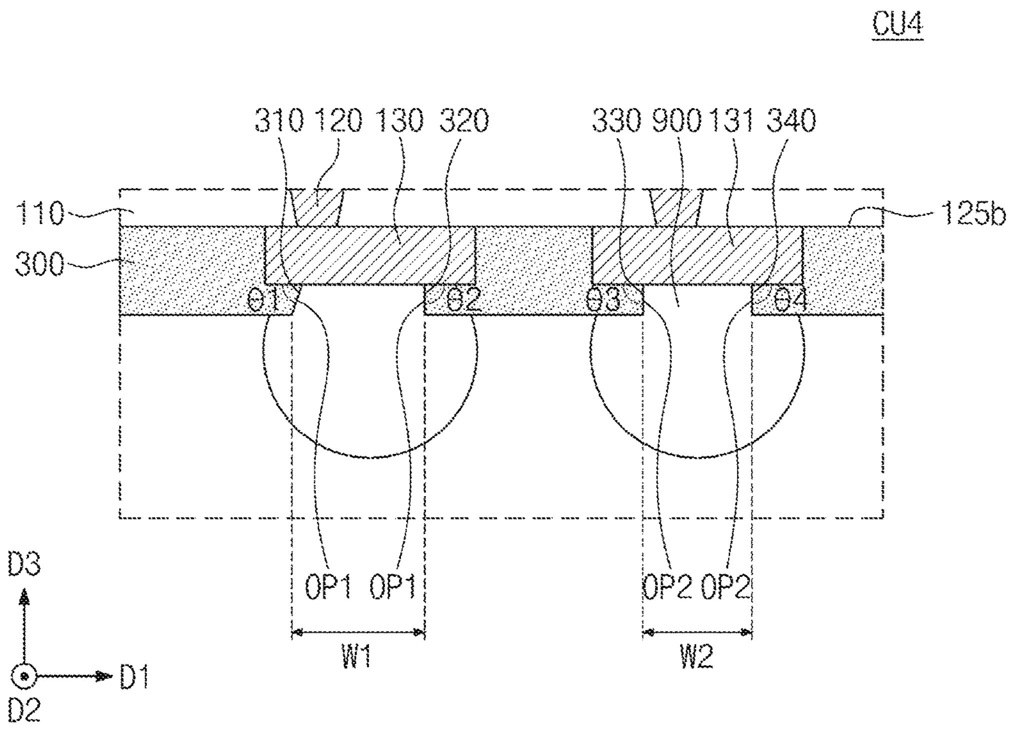
FIG. 11 is an enlarged view showing section CU4 of FIG. 10.
Figure 12:
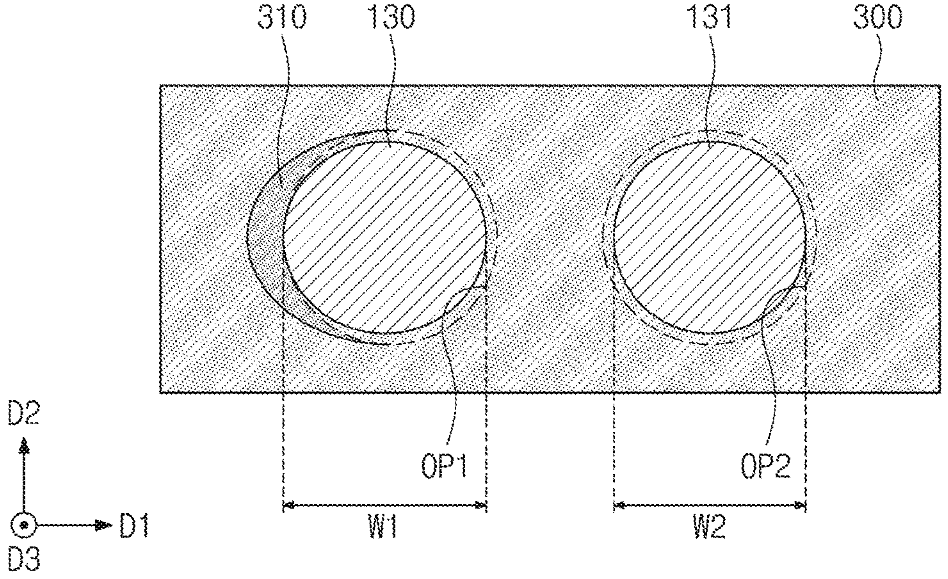
FIG. 12 is a bottom view depicting a state in which an external connection terminal is omitted in FIG. 10.

FIG. 10 is a cross-sectional view showing a semiconductor package 2 according to some embodiments of the present inventive concepts. FIG. 11 is an enlarged view showing section CU4 of FIG. 10. FIG. 12 is a bottom view of FIG. 10 depicting a state in which the external connection terminal 900 is. To the extent that a elements have not been described in detail herein, it may be assumed that they are at least similar to corresponding elements that have been described in FIGS. 1 to 4.

Referring to FIGS. 10 to 12, in the semiconductor package 2 according to some embodiments of the present inventive concepts, the second solder resist pattern 300 may at least partially cover a portion of the bottom surface of the substrate pad 132. In conclusion, as illustrated in a bottom view of FIG. 12 where the external connection terminal 900 is absent, the first wiring layer 125 of the package substrate 100 may not be exposed.

Figure 13:
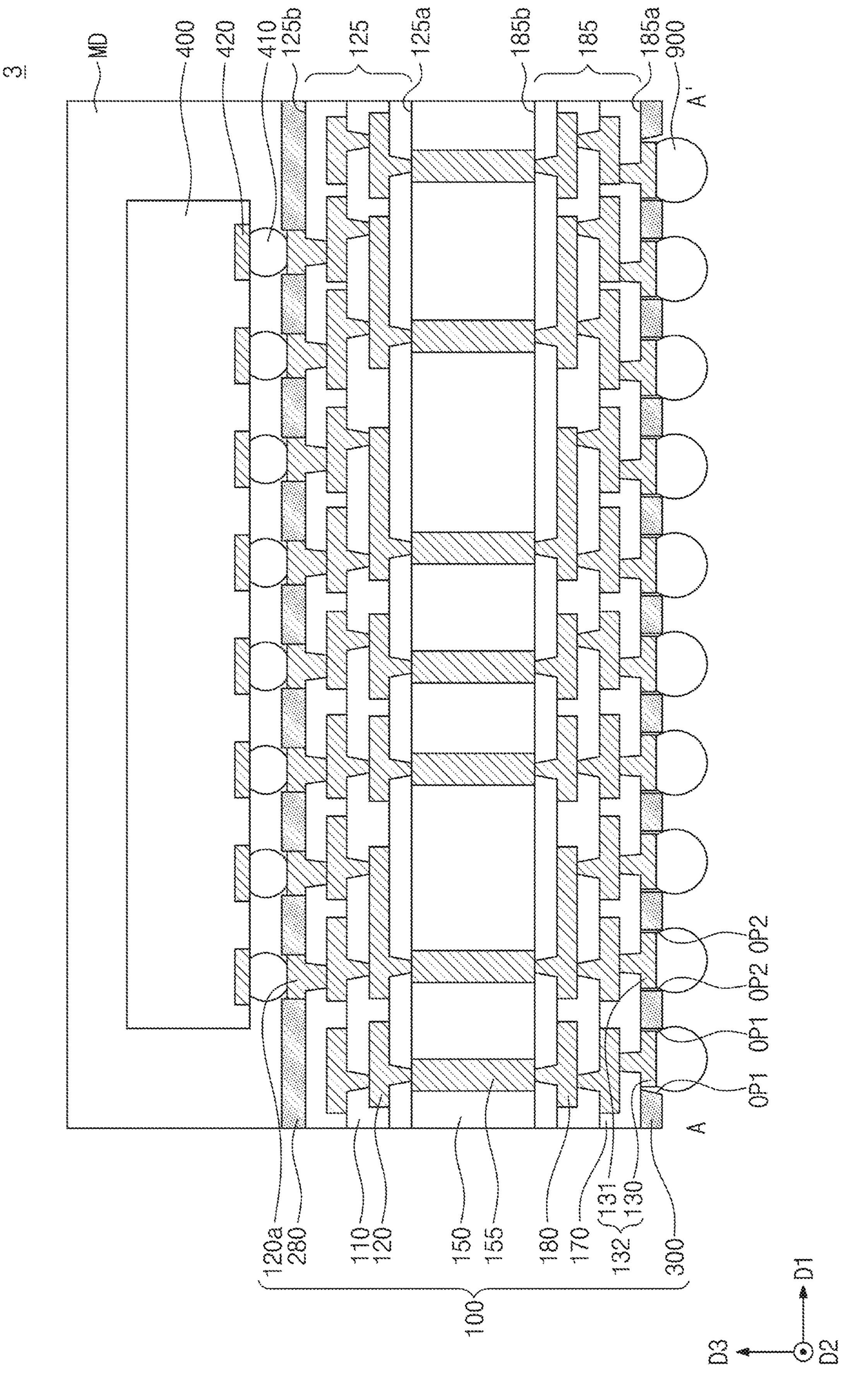
FIG. 13 is a cross-sectional view showing a semiconductor package according to some embodiments of the present inventive concepts.

FIG. 13 is a cross-sectional view showing a semiconductor package 3 according to some embodiments of the present inventive concepts. To the extent that a elements have not been described in detail herein, it may be assumed that they are at least similar to corresponding elements that have been described in FIGS. 1 to 4.

Referring to FIG. 10, the package substrate 100 may include a first wiring layer 125, a second wiring layer 185, and a core layer 150. The second wiring layer 185 may be disposed farther away from the first wiring layer 125 than the semiconductor chip 400. The second solder resist pattern 300 may be disposed on a bottom surface of the second wiring layer 185. The second wiring layer 185 may include components substantially the same as those of the first wiring layer 125 discussed above.

The core layer 150 may be disposed between the first wiring layer 125 and the second wiring layer 185. The core layer 150 may include a dielectric material. The core layer 150 may include a glass fiber or a resin. The glass fiber may be obtained by twisting several hundreds of glass filaments, a type of reinforcing material, to manufacture yarns which are then woven together. The glass filament may be a processed ore product mainly composed of silica. The core layer 150 may serve to maintain stiffness of the package substrate 100 and may also serve as a base substrate on which the first wiring layer 125 is formed in fabrication process.

The core layer 150 may include a through electrode 155 that vertically penetrates the core layer 150. For example, the core layer 150 may at least partially surround lateral sides of the through electrode 155. The first wiring layer 125 and the second wiring layer 185 may be electrically connected through the through electrode 155. The through electrode 155 may include a conductive material, such as copper (Cu).

A semiconductor package according to some embodiments of the present inventive concepts may include a solder resist pattern 280 and 300 that covers a wiring layer 125 and 185 of a package substrate 100. The solder resist patterns 280 and 300 may include openings that expose pads on the wiring layer 125 and 185, and a cross-section of the opening that exposes the pad positioned in the nearest an end of a row may include a first inner lateral surface 310 and a second inner lateral surface 320 that face each other. The first inner lateral surface 310 may be positioned closer to a lateral surface of the first wiring layer 125 than the second inner lateral surface 320 and may have a slope θ1 ranging from about 10° to about 80°.

As the first inner lateral surface 310 has the slope θ1, the inclined shape may facilitate a stable attachment of an external connection terminal 900 to the first pad 130. In addition, the slope θ1 may be formed by performing an etching process on only one inner lateral surface of the first opening OP1 of the openings OP1 and OP2 included in the second solder resist pattern 300.

The aforementioned description provides some embodiments for explaining the present inventive concepts. Therefore, the present inventive concepts are not necessarily limited to the embodiments described above, and it will be understood by one of ordinary skill in the art that variations in form and detail may be made therein without departing from the spirit and essential features of the present inventive concepts.

What is claimed is:

1. A semiconductor package, comprising:
a package substrate;
a semiconductor chip on the package substrate,
wherein the package substrate includes:
a wiring layer;
a plurality of pads arranged in rows on the wiring layer; and
a solder resist pattern on the wiring layer,
wherein the solder resist pattern includes openings that expose the pads,
wherein a first opening is positioned nearest an end of a row, wherein the first opening has a cross-section including a first inner lateral surface and a second inner lateral surface that face each other,
and
wherein a slope of the first inner lateral surface is about 10 or more degrees less than a slope of the second inner lateral surface.

2. The semiconductor package of claim 1, further comprising an external connection terminal on a pad exposed by the first opening.

3. The semiconductor package of claim 1, wherein the slope of the first inner lateral surface is in a range of about 10° to about 80°.

4. The semiconductor package of claim 1, wherein the first inner lateral surface and the second inner lateral surface are asymmetric about the pad positioned nearest an end of the row.

5. The semiconductor package of claim 1, wherein the slope of the second inner lateral surface is about 90°.

6. The semiconductor package of claim 1, wherein another of the openings that exposes another pad other than the pad exposed by the first opening includes a third inner lateral surface and a fourth inner lateral surface that face each other, wherein a slope of the third inner lateral surface is the same as a slope of the fourth inner lateral surface.

7. The semiconductor package of claim 6, wherein the slope of the third inner lateral surface and the slope of the fourth inner lateral surface are the same as the slope of the second inner lateral surface.

8. The semiconductor package of claim 6, wherein the slope of the third inner lateral surface and the slope of the fourth inner lateral surface are about 90°.

9. The semiconductor package of claim 1, wherein a bottom surface of the solder resist pattern is at a level lower than a level of bottom surfaces of the pads.

10. The semiconductor package of claim 1, wherein the solder resist pattern covers portions of bottom surfaces of the pads.

11. A semiconductor package, comprising:

a substrate; and a semiconductor chip on the substrate, wherein the substrate includes:

a wiring layer;

a plurality of pads arranged in rows on the wiring layer; and a solder resist pattern that covers the wiring layer, wherein the solder resist pattern includes openings that correspondingly expose the pads, wherein the pads include:

a first pad positioned nearest an end of a first row; and a second pad positioned adjacent to the first pad, wherein the openings include:

a first opening that exposes the first pad; and a second opening that exposes the second pad, wherein the first opening has a width that is larger than the width of the second opening, and wherein the width of the first opening decreases with decreasing distance from a top surface of the first pad.

12. The semiconductor package of claim 11, wherein the width of the first opening is in a range of about 130 μm to about 150 μm.

13. The semiconductor package of claim 11, wherein the width of the second opening is constant.

14. The semiconductor package of claim 11, wherein a cross-section of the first opening includes a first inner lateral surface and a second inner lateral surface that face each other, wherein the first inner lateral surface is closer than the second inner lateral surface to a lateral surface of the wiring layer, and wherein the first inner lateral surface and the second inner lateral surface are asymmetric about the first pad.

15. The semiconductor package of claim 14, wherein a length of the first inner lateral surface in a direction toward a pad is greater than a length of the second inner lateral surface.

16. A semiconductor package, comprising:

a package substrate;

a semiconductor chip on the package substrate; and a molding layer that covers the semiconductor chip and a top surface of the package substrate, wherein the package substrate includes:

a wiring layer;

a plurality of pads on the wiring layer; and a solder resist pattern that covers the wiring layer, wherein the solder resist pattern has a tetragonal shape with four edges, wherein the solder resist pattern includes:

a first opening close to the four edges; and a second opening farther away than the first opening from the four edges, wherein the first opening and the second opening expose the pads, wherein a cross-section of the first opening includes a first inner lateral surface and a second inner lateral surface that face each other, wherein the first inner lateral surface is closer than the second inner lateral surface to a lateral surface of the wiring layer, and wherein the first inner lateral surface has a slope of about 10° to about 80°.

17. The semiconductor package of claim 16, wherein the first opening has an oval shape when viewed in plan, and the second opening has a circular shape when viewed in plan.

18. The semiconductor package of claim 16, further comprising an external connection terminal on a pad adjacent an end of a row, wherein the second opening includes a third inner lateral surface and a fourth inner lateral surface that face each other, wherein a slope of the third inner lateral surface and the slope of the fourth inner lateral surface are about 90°.

19. The semiconductor package of claim 16, wherein the first opening has a first width, the second opening has a second width, and the first width is greater than the second width.

20. The semiconductor package of claim 16, wherein a space that the second opening occupies in the solder resist pattern has a size greater than a size of a space that first opening occupies in the solder resist pattern.

* * * * *